United States Patent
Ruoff et al.

(10) Patent No.: US 7,408,712 B2
(45) Date of Patent: Aug. 5, 2008

(54) POLARIZATION-SELECTIVELY BLAZED, DIFFRACTIVE OPTICAL ELEMENT

(75) Inventors: Johannes Ruoff, Oberkochen (DE); Bernd Kleemann, Aalen (DE)

(73) Assignee: Carl Zeiss AG, Jena (DE)

( * ) Notice: Subject to any disclaimer, the term of this patent is extended or adjusted under 35 U.S.C. 154(b) by 322 days.

(21) Appl. No.: 11/206,886

(22) Filed: Aug. 18, 2005

(65) Prior Publication Data
US 2006/0039072 A1   Feb. 23, 2006

(30) Foreign Application Priority Data
Aug. 20, 2004   (DE)   ........................ 10 2004 040 535

(51) Int. Cl.
G02B 5/18   (2006.01)
(52) U.S. Cl. ........................ 359/571; 359/575; 359/574; 359/486; 359/494
(58) Field of Classification Search ................... 359/489
See application file for complete search history.

(56) References Cited

U.S. PATENT DOCUMENTS

| 7,261,425 | B2 * | 8/2007 | Benson et al. | ............... 359/530 |
| 2002/0063962 | A1 | 5/2002 | Takada et al. | |
| 2005/0207012 | A1 * | 9/2005 | Arnold et al. | ............... 359/571 |
| 2006/0132920 | A1 * | 6/2006 | Kleemann | .................... 359/565 |
| 2006/0193052 | A1 * | 8/2006 | Kleemann | .................... 359/565 |

FOREIGN PATENT DOCUMENTS

| JP | 2002-014213 | 1/2002 |
| JP | 2002-303713 | 10/2002 |
| WO | WO 2004/025335 A1 | 3/2004 |

OTHER PUBLICATIONS

Churin et al., "Polarization configurations with singular point formed by Computer generated holograms," *Optics Communications*, vol. 99, pp. 13-17 (1993).

Dorn et al., "The focus of light—linear polarization breaks the rotational symmetry of the focal spot," *Journal of Modern Optics*, vol. 50, No. 12, pp. 1917-1926 (2003).

(Continued)

*Primary Examiner*—Arnel C Lavarias
(74) *Attorney, Agent, or Firm*—Patterson, Thuente, Skaar & Christensen, P.A.

(57) ABSTRACT

A polarization-selectively blazed, diffractive optical element including multiple contiguous blaze structures extending along a given geometrical path. Each structure has a width perpendicular to direction of extension greater than the Wavelength of the electromagnetic radiation for which the element is designed. Each blaze structure multiple individual substructures arranged next to each other in the direction of extension according to a predetermined period. The substructures providing the blaze effect have the shape, when viewed from above, of a closed geometrical surface whose dimension parallel to the direction of extension varies perpendicular to the direction of extension, but is always smaller than the wavelength of the electromagnetic radiation, and whose maximum dimension perpendicular to the direction of extension is greater than the wavelength of the electromagnetic radiation. The filling ratio of the individual substructures in the direction of extension relative to the period is selected such that, as a function of the position perpendicular to the direction of extension, the blaze effect is optimized for one polarization condition.

23 Claims, 4 Drawing Sheets

OTHER PUBLICATIONS

Dorn et al., "Sharper Focus for a Radially Polarized Light Beam," *Physical Review Letters*, vol. 19, No. 23, pp. 233901-1-233901-4 (2003).

Hossfeld et al., "Polarizing computer-generated holograms," *Optical Engineering*, vol. 32, No. 8, pp. 1835-1837 (1993).

Quabis et al., "Focusing light to a tighter spot," *Optics Communications*, vol. 179, pp. 1-7 (2000).

Quabis et al., "The focus of light—theoretical calculation and experimental Tomographic reconstruction," *Appl. Phys. B*, vol. 72, pp. 109-113 (2001).

Quabis et al., "Reduction of the spot size by using a radially polarized laser beam," Physics Department, Chair for Optics, University Erlangen-Nürnberg, pp. 1-8.

Mait et al., "Design of binary subwavelength diffractive lenses by use of Zeroth-order effective-medium theory," *J. Opt. Soc. Am. A*, vol. 16, No. 5, pp. 1157-1167 (1999).

Yu et al., "Synthesis of polarization-selective optical components with multi-Layer subwavelength structures," *Proc. of SPIE*, vol. 5183, pp. 184-191 (2003).

* cited by examiner

POLARIZATION-SELECTIVELY BLAZED, DIFFRACTIVE OPTICAL ELEMENT

FIELD OF THE INVENTION

The invention relates to a polarization-selectively blazed, diffractive optical element.

BACKGROUND OF THE INVENTION

Focused light beams are employed in many optical fields, such as lithography, confocal microscopy, optical data storage, for example, or in optical particle traps. It is important in all of these applications to obtain the smallest possible focusing radius, which can be achieved only by the use of high-aperture optical systems. In this connection, it is increasingly important, however, to consider the polarization properties of the electromagnetic field. Thus, for example, in the case of a linearly polarized, high-aperture light beam, the energy distribution in the focus no longer has rotation symmetry to the optical axis, but is elliptically deformed. A particular shape of the intensity and polarization distribution in the focus can be achieved by specifically setting the polarization distribution within the cross-section of the light beam. In this case, radially or azimuthally polarized beams are of particular interest, because the former have a strong longitudinal electrical component near the focus, whereas in the case of the latter, the electrical field in the focal center disappears completely. It has been shown that the use of radially polarized light beams allows to generate the smallest possible spot diameters so far. Therefore, it is important to have optical elements which transform an unpolarized light beam into one having a well-defined polarization distribution.

Further important fields of application requiring a spot diameter which is as small as possible are microscopic wafer inspection as well as high-resolution material microscopy.

However, so far, it has been very complex to generate radially or azimuthally polarized light. It may be generated, for example, in the laser resonator by superimposing $TEM_{01}$ and $TEM_{10}$ Hermite Gauss modes being polarized orthogonally to each other, or in the beam path by the use of a Mach Zehnder-type interferometer. It is also possible to use mode-forming, holographic and birefringent elements.

In view thereof, it is an object of the invention to provide an optical element, which is suitable for selectively deflecting only one desired polarization, and, if required, to adjust the orientation of this polarization in the deflected beam according to a given path line in the beam cross-section.

The object is achieved by a polarization-selectively blazed, diffractive optical element comprising a plurality of contiguous blaze structures, which extend along a given geometrical path and each have a width perpendicular to their direction of extension, said width being greater than the wavelength of the electromagnetic radiation for which the diffractive optical element is designed, and each of said structures comprising a plurality of individual substructures, which are arranged next to each other according to a predetermined period in the direction of extension, said substructures providing the blaze effect and each having the shape, when viewed from above, of a closed geometrical surface whose dimension parallel to the direction of extension varies perpendicular to the direction of extension, but is always smaller than the wavelength of the electromagnetic radiation, and whose maximum dimension perpendicular to the direction of extension is greater than the wavelength of the electromagnetic radiation, wherein the filling ratio of the dimension of the individual structures in the direction of extension relative to the predetermined period is selected such, as a function of the position perpendicular to the direction of extension, that the blaze effect is optimized for one of two mutually orthogonal polarization conditions of the electromagnetic radiation.

The desired polarization selectivity of the diffractive optical element is achieved by the sub-wavelength pattern of the individual blaze structures along the direction of extension by means of the individual substructures. The electromagnetic radiation of only one polarization condition is predominantly directed into the predetermined blaze order, so that the blaze efficiency of one polarization condition is considerably greater than that of the other. In particular, the blaze efficiency is improved by more than 50% for one polarization condition as compared to the other. However, if the filling ratio is appropriately selected, the blaze efficiency for one polarization condition may even be more than twice as high and may even be one to several orders of magnitude better than for the other polarization condition.

Any statements made herein with regard to the direction of extension always refer to the respective local direction of extension. If the geometrical shape of the blaze structures is a circular ring shape, for example, then the radial direction is always perpendicular to the direction of extension, and the tangential direction is parallel to the direction of extension.

The blaze effect of the individual substructures is obtained because, due to the sub-wavelength pattern in the direction of extension, said pattern cannot be resolved directly by the electromagnetic radiation, so that it only sees a refractive index averaged via at least one (preferably more) individual substructures, said refractive index varying locally due to the geometrical shape of the individual substructures in a direction perpendicular to the direction of extension. This effective profile of the refractive index perpendicular to the direction of extension for the electromagnetic radiation is now adapted so as to achieve the desired blaze effect. In particular, the desired blaze effect can be achieved by a linear increase in the refractive index in a direction perpendicular to the direction of extension. However, this linear increase can usually be achieved only for one of two orthogonal polarization conditions, because averaging of the refractive index is effected differently for the different polarization conditions. Therefore, if the filling ratio is selected such that the blaze effect is optimized for one of two polarization conditions, which are orthogonal to each other, the blaze effect for the other of said two polarization conditions deteriorates at the same time (as compared to the case where the blaze effect is best for unpolarized light and, thus, for both polarization conditions at the same time).

Since the individual substructures, when viewed from above, have the shape of a closed geometrical surface, they and, thus, also the optical element can be easily manufactured, e.g. by means of known methods of semiconductor manufacture.

The individual substructures are usually arranged such that always just one individual substructure is provided in each blaze period perpendicular to the direction of extension. The individual substructures are thus arranged next to each other in the direction of extension.

The two orthogonal polarization conditions are preferably linear polarization conditions. If the blaze structures have a circular ring shape, for example, beams can thus be generated which are radially or azimuthally polarized.

In particular, the width of the individual blaze structures may be varied such that the diffractive optical element still has an imaging effect, i.e. acts as a lens. The width of adjacent blaze structures may decrease, increase, or decrease and then increase again, or increase and then decrease again. The width of the individual blaze structures along the direction of extension is preferably constant or varies randomly or with a statistic distribution around a mean value.

In a particularly preferred embodiment of the diffractive optical element according to the invention, the individual substructures comprise a first layer having a first refractive index and a second layer having a second refractive index that is different from the first refractive index, said second layer being arranged on the first layer. In particular, a third layer having the second refractive index is arranged between the individual substructures in the region of the first layer. This stacked configuration of the individual substructures allows the achievement of an extraordinarily high degree of polarization of the blaze order (ratio of the transmission of one optimized polarization condition of the desired blaze order to the sum of both polarization conditions of the desired blaze order). The degree of polarization may be 80% to 99.9%.

In particular, the second and third layers are equal in height. This considerably simplifies the production of the diffractive optical element, because only one further coating step needs to be carried out after forming the first layer of the individual substructures, if they are provided in an elevated form on the surface of a carrier, which further step then causes the layer thus applied to be located either as a second layer on the individual substructures or as a third layer between the individual substructures. Of course, if desired, a fourth layer may be applied on the third layer, said fourth layer having a refractive index which differs at least from that of the second layer.

It is further possible that the individual substructures may comprise a first layer having a first refractive index and a second layer having a second refractive index, which second layer is arranged on the first layer, and that further individual structures are arranged between the individual substructures, which further structures comprise a third layer having a third refractive index and a fourth layer arranged on the third layer, said fourth layer having a fourth refractive index. All of the refractive indices may be different. Further, all of the individual layers may have different heights. In particular, the individual structures are provided so as to fill the entire space between the individual substructures.

The filling ratio of the individual substructures which comprise the first and second layers is preferably selected such that it does not cover the entire range of from 0 to 1. The size of the range covered by the filling ratio is preferably not greater than 0.7, in particular not greater than 0.5. For the individual substructures comprising only one layer, the filling ratio may also be selected in the same manner.

The diffractive optical element may preferably be provided such that the individual substructures are contiguous perpendicular to the direction of extension of the blaze structures. Of course, they may also be spaced apart perpendicular to the direction of extension, which may depend, for example, on manufacture. The individual substructures may be contiguous or may be spaced apart in the direction of extension.

When viewed from above, the individual substructures may have the shape of a trapeze, or of any other quadrangle or polygon, in particular of a triangle, with at least one side thereof preferably having a curved shape. It is further possible to provide the individual substructures so as to respectively have symmetry to an axis perpendicular to the direction of extension.

At least one side of the individual substructures may be approximated by a stepped curve.

A preferred embodiment of the diffractive optical element according to the invention consists in that, in addition to a region comprising the individual substructures, the element comprises a further region including conventional blaze structures having an at least approximately ramp-shaped profile. If the blaze structures form an annular geometrical shape together with the individual substructures, the region comprising the conventional blaze structures is preferably arranged in the center of the element, i.e. where the blaze period (perpendicular to the direction of extension) is the greatest in blazed, diffractive optical elements for imaging.

The predetermined geometrical shape may be either a closed path (annular path) or an open path. The closed path may be a circular ring shape, an elliptic shape, a polygon shape or any other type of curved shape. The open path may comprise part of a self-contained path line, any other curved or polygon-type shape, or may even be linear. The width of the blaze structures (dimension perpendicular to the direction of extension) may be varied as a function of the position in the direction of extension in order to achieve a desired imaging property. If the blaze structures extend along closed path lines, the blaze structures may be arranged concentrically to each other.

The predetermined shape is selected, in particular, as a function of a desired imaging property of the element and/or a structured illumination which emits the electromagnetic radiation for which the element is optimized. The structured illumination may be, for example, a ring, dipole or quadrupole illumination.

The diffractive optical element is preferably a transmissive element.

The individual substructures may be provided with an elevated shape on the top surface of a carrier. However, it is also possible for the individual substructures to be embedded in a carrier (e.g. having a planar top surface) and to have a refractive index which differs from the refractive index of the laterally surrounding carrier material.

The individual substructures may be provided as doping zones or as depletion zones in the carrier material.

In particular, the diffractive optical element may be designed for electromagnetic radiation having a wavelength in the visible spectral region, in the infrared region or in the UV region.

Preceding or following the diffractive element, there may be arranged a phase element which causes a locally varying phase displacement in the electromagnetic beam incident on or coming from the diffractive element. The phase element is preferably a transmissive element which may be provided as a separate element or integrally with the diffractive element. If it is provided integrally with the diffractive element, it is preferably not provided on that side on which the blaze structures are formed.

For example, if the diffractive element comprises blaze structures having point symmetry, there may be out-of-phase or in-phase oscillations of the light fields of two points having point symmetry to the center of the beam cross-section of the beam transmitted by the diffractive element. The locally varying phase displacement is then selected such, for example, that these light fields, if desired, oscillate in-phase or out-of-phase, respectively. For this purpose, the phase element, for example, may be provided such that its thickness increases (in a spiral-shaped manner) as a function of the angular position, said thickness being selected such, in particular, that a phase delay of $2\pi$ is achieved after 360°. Of course, the phase element may also be provided such that it imposes other locally varying phase displacements on the beam.

Further, a polarization element may be arranged preceding the diffractive element, said polarization element pre-polarizing the electromagnetic beam for the diffractive element at least partially into said one orthogonal polarization condition.

Thus, an already pre-polarized beam which predominantly has said one desired orthogonal polarization condition, is incident on the diffractive element. The polarization element is preferably not of the imaging type, so that it contributes, together with the diffractive element, if the latter is an imaging element, to a further improvement of the polarizing effect, whereas the imaging effect is caused exclusively or mainly by the diffractive element.

Further, an objective is also provided which contains at least one diffractive optical element according to the invention or a described further embodiment thereof. The objective may be, for example, a microscope objective or an objective used in semiconductor lithography and may comprise further lenses or optically effective elements, respectively.

BRIEF DESCRIPTION OF THE DRAWINGS

The invention will be explained in more detail below, by way of example and with reference to the drawings, wherein.

DETAILED DESCRIPTION OF THE INVENTION

Figure 1:
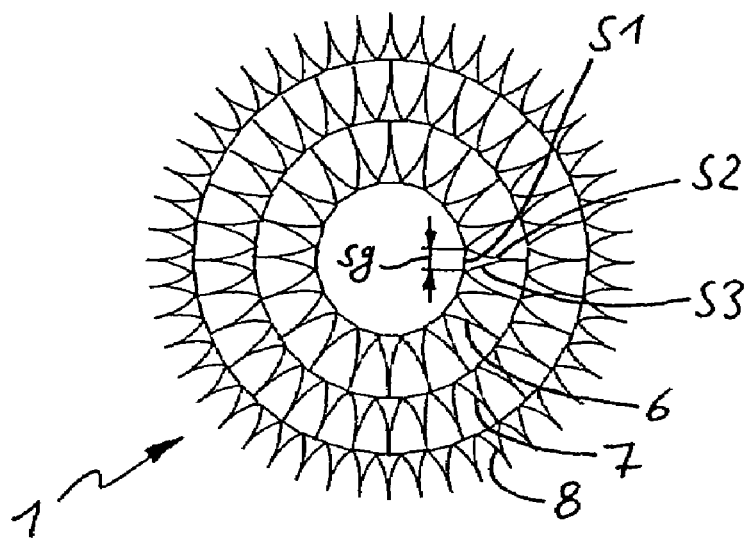
FIG. 1 shows a top view of a first embodiment of a polarization-selectively blazed, diffractive optical element.
Figure 4:
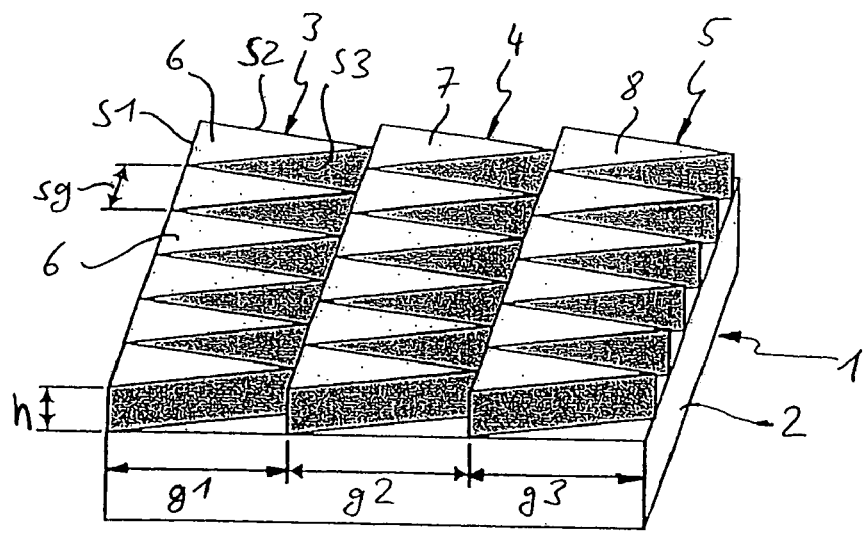
FIG. 4 shows a schematic principle scheme explaining the individual substructures of the element of FIG. 1.

The polarization-selectively blazed, diffractive lens 1 shown in FIG. 1 comprises a transmissive carrier 2 having a refractive index n1, as shown, in particular, in FIG. 4. A multiplicity of circular ring-shaped blaze structures 3, 4, 5 of the carrier material are arranged on the upper surface of the carrier 2, said structures having widths g1, g2, g3, which are respectively greater than the wavelength of the electromagnetic radiation for which the lens 1 is optimized.

Each blaze structure 3, 4, 5 comprises a multiplicity of individual substructures 6, 7, 8, each having a substantially triangular shape and consisting of a different material preferably having a higher refractive index than the carrier material. When viewed from above, the individual substructures 6, 7, 8 thus comprise a base S1, respectively arranged parallel to the direction of extension of the blaze structures 3, 4, 5 (i.e., in this case, in the circumferential direction R1, R2, R3), as well as two further sides S2 and S3, which have a concave curved shape in this case. This curved design of the sides S2 and S3 is not indicated in the perspective view of FIG. 4 for a simplified illustration. Also, FIG. 4 does not show the width of the blaze structures 3, 4 and 5, which decreases with the radial distance from the center of the lens 1. In fact, g1>g2>g3 applies.

Of course, g1=g2=g3, g1>g2<g3, g1<g2<g3 or other dimensional relationships between these widths may be present. The widths g1, g2 and g3 are constant here in the direction of extension R1, R2, R3. However, the widths g1, g2 and g3 may also vary in the direction of extension.

In this case, the length of the base S1 corresponds to the period sg of the arrangement of the individual substructures 6, 7, 8 in the direction of extension R1, R2, R3 of the blaze structures 3, 4 and 5 and is smaller than the wavelength of the electromagnetic radiation of use. Thus, a sub-wavelength pattern formed in the direction of extension R1, R2, R3 of the blaze structures 3, 4 and 5 is present, which pattern cannot resolve the electromagnetic radiation anymore and, thus, only sees an averaged effective refractive index in the direction of extension R1, R2, R3. For each point along the blaze period, said averaged effective refractive index depends on the ratio of the dimension of the individual substructures 6, 7, 8 in the direction of extension R1, R2, R3 at said point to the period or the sub-wavelength period sg, respectively. For example, air having a refractive index of $n_2=1$ is present between the individual substructures 6, 7 and 8.

Figure 2:
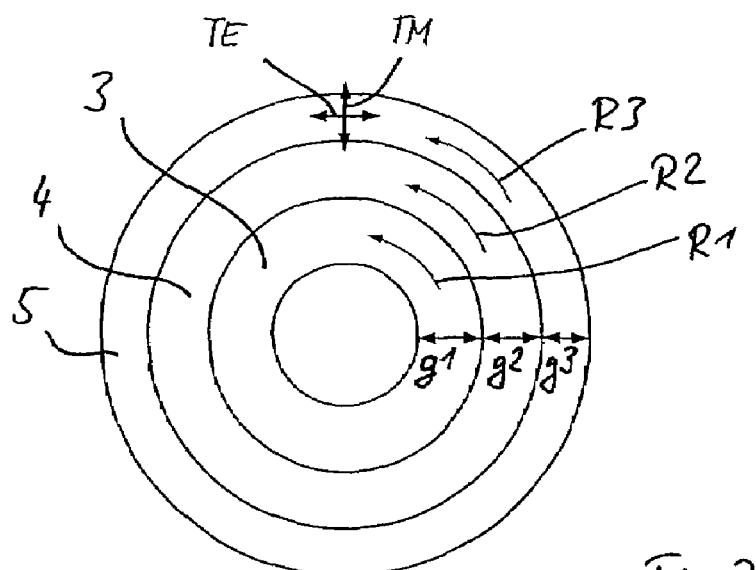
FIG. 2 shows a simplified schematic representation of FIG. 1.

Since a sub-wavelength pattern is present in the direction of extension R1, R2, R3, said pattern is a so-called zero order grating in the direction of extension R1, R2, R3, allowing only the zeroth order of diffraction to propagate. The refractive index profile of the effective refractive index in the direction of the blaze period (i.e. in a radial direction) is now selected by means of the shape of the individual substructure 6, 7 and 8 so as to produce the predetermined blaze effect, because the electromagnetic radiation only sees one (in this case, for example, a linearly decreasing) effective refractive index profile in the radial direction. Now, in order to make the lens 1 polarization-selective, advantage is taken of the effect that the averaging of the electromagnetic radiation via these individual substructures 6, 7 and 8 depends on the polarization of the electromagnetic radiation. For example, the sub-wavelength pattern can be optimized for the TM polarization of the blaze grating (i.e. the linear polarization, which oscillates locally perpendicular to the direction of extension R1, R2, R3, as indicated in FIG. 2), or for the TE polarization, i.e. the polarization which oscillates locally parallel to the direction of extension R1, R2, R3.

Figure 3:
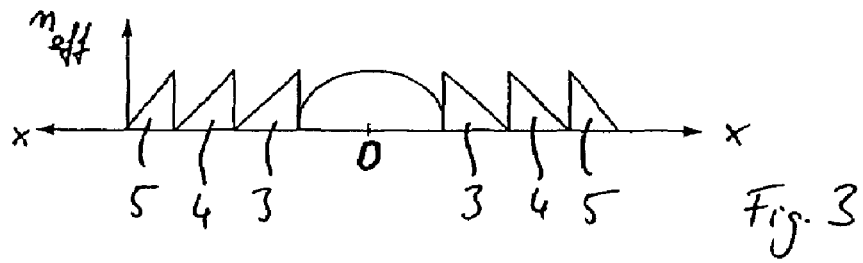
FIG. 3 shows the radial profile of the effective refractive index of the element of FIG. 1.

For example, if a linear profile of the averaged effective refractive index $n_{eff}$ is desired for the blaze structures 3, 4, 5, as shown in FIG. 3, the linear profile of the effective refractive index or the effective index of refraction can only be achieved either for the TM polarization or for the TE polarization, respectively. The other polarization, i.e. the TM polarization or the TE polarization, respectively, then only sees a non-linear profile and is, therefore, blazed to a substantially lesser degree (i.e. diffracted to a substantially lesser degree in the desired order of diffraction).

The effective refractive index for the TM polarization is calculated as follows according to the so-called Effective Medium Theory (EMT), if the period sg of the sub-wavelength pattern is very much smaller than the wavelength λ of the electromagnetic radiation:

$$n_{\mathit{eff},TM}^2 = f n_1^2 + (1-f) n_2^2 \qquad (1)$$

The following holds for the TE polarization:

$$n_{\mathit{eff},TE}^2 = \frac{n_1^2 n_2^2}{f n_2^2 + (1-f) n_1^2} \qquad (2)$$

In this case, f is the filling ratio, which describes the ratio of the dimension of the individual substructures 6, 7, 8 in the direction of extension R1, R2, R3 of the blaze structure 3, 4 and 5 relative to the period sg of the sub-lambda wavelength pattern for a predetermined point within the blaze period.

Now, if an optimal blaze efficiency is to be achieved for a certain polarization, the profile of the effective refractive index needs to be a linear function for the lens shown in FIG. 1. If $n_{\mathit{eff}}(x)$ is given (x=radial coordinate in each blaze period), the respective filling ratio profile f(x) can be determined from formulas (1) and (2). If, for example, an optimal blaze effect is to be achieved for the TM polarization, the respective filling ratio is obtained from formula (1):

$$f_{TM}(x) = \frac{n_{\mathit{eff}}^2(x) - n_2^2}{n_1^2 - n_2^2} \qquad (3)$$

Figure 5:
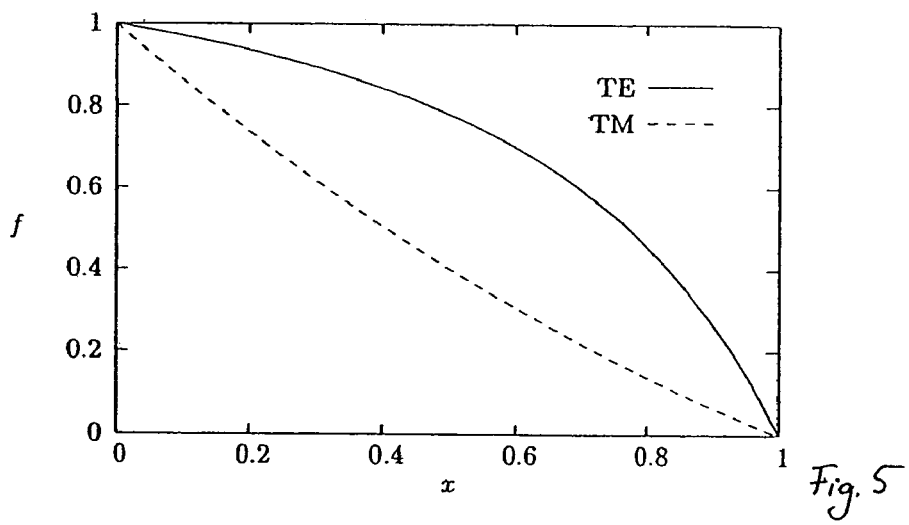
FIG. 5 shows a diagram which illustrates the optimal profile of the filling ratio for a blaze period in the case of TE polarization and of TM polarization.
Figures 6, 7:
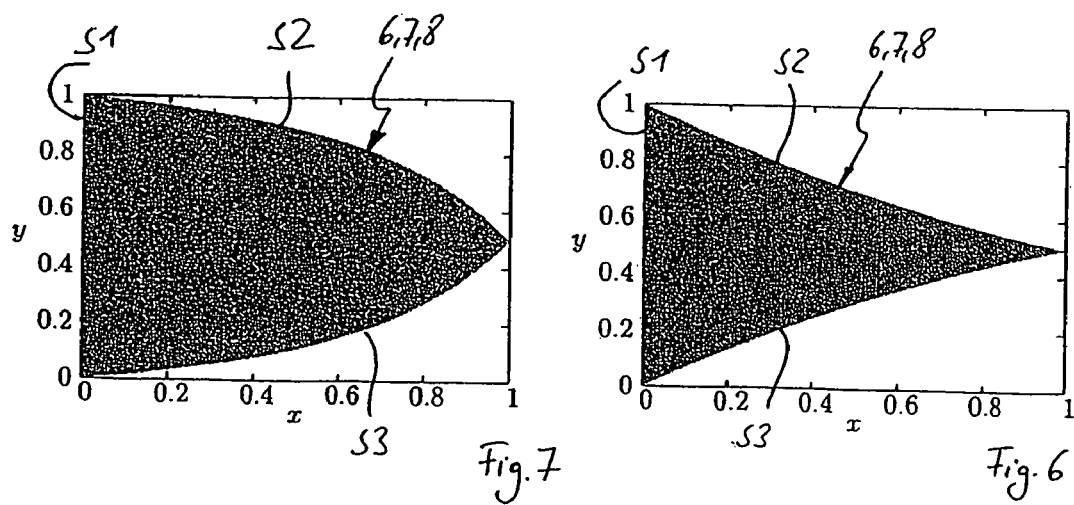
FIG. 6 shows a possible shape of the individual substructure for an optimized blaze effect in the case of TM polarization.
FIG. 7 shows a possible shape of the individual substructure for an optimized blaze effect in the case of TE polarization.

FIG. 5 shows the filling ratio profile for the TM polarization within a blaze period g1, g2, g3, wherein, for simplification, the blaze period has been standardized to one and it is assumed that $n_1=2.3$ and $n_2=1$. The filling ratio profile for the TM polarization is shown in broken lines. Since formula (3) is a non-linear relationship, the sides S2 and S3 of the individual substructures are no longer straight lines, but curved lines. The shape of the individual substructures 6, 7, 8 for the TM polarization is shown in FIG. 6, wherein, again, only one blaze period, which has been standardized to 1, is shown (x-coordinate). The y-coordinate is also standardized to one and specifies the dimension in the direction of extension R1, R2, R3, wherein y=1 corresponds to the period sg. As shown in FIG. 6, the individual substructure 6, 7, 8 is designed such that it has symmetry to an axis which passes through the tip on the right-hand side and is perpendicular to the base S1.

The lens 1 schematically shown in FIG. 1 comprises the individual substructures 6, 7, 8 of FIG. 6 and is thus optimized for the TM polarization. Therefore, the blaze order of the lens 1 mainly contains TM-polarized radiation. Said radiation is thus radially polarized. The lens 1 of FIG. 1 provides an imaging optical element which, in addition to its desired imaging property, simultaneously also generates a desired polarization.

Of course, the individual substructures 6, 7, 8 need not have such symmetry as shown in FIG. 6. It is also possible for them to have the shape of a right triangle, when viewed from above, wherein the hypotenuse is then correspondingly curved in order to realize the determined filling ratio profile.

If the optimal blaze effect for the TE polarization is to be achieved, the above formula (2) yields the following filling ratio profile:

$$f_{TE}(x) = \frac{n_1^2(n_{\mathit{eff}}^2(x) - n_2^2)}{n_{\mathit{eff}}^2(x)(n_1^2 - n_2^2)} \qquad (4)$$

$$= \frac{n_1^2}{n_{\mathit{eff}}^2(x)} f_{TM}(x)$$

The filling ratio profile for the TE polarization is shown by the solid line in FIG. 5. FIG. 7 shows a top view of the corresponding shape of the individual substructures 6, 7, 8 in the same manner as FIG. 6.

The height h of the individual substructures 6, 7, 8 is selected such that the blaze effect is optimal. For large grating widths and nearly perpendicular incidence, the height h is obtained by approximation from the equation $(\max(n_{\mathit{eff}}) - \min(n_{\mathit{eff}})) h = \lambda$, wherein λ is the wavelength of the electromagnetic radiation and $\max(n_{\mathit{eff}})$ as well as $\min(n_{\mathit{eff}})$ are respectively the maximum and the minimum values of the effective refractive index for the desired polarization (TE- or TM-polarization).

The above formulas apply in case the sub-wavelength period sg is very much smaller than the wavelength of the radiation. However, if the sub-wavelength period is insignificantly smaller than the wavelength of use (e.g. 1.5 to 5 times smaller), the formulas according to the Effective Medium Theory will have to be extended by additional terms which depend on the ratio of the sub-wavelength period sg to the wavelength X of the radiation. For a given profile of the effective refractive index $n_{\mathit{eff}}(x)$, however, the local filling ratio f(x) can always be determined in the same manner so as to optimize the blaze efficiency for the desired polarization.

Figure 8:
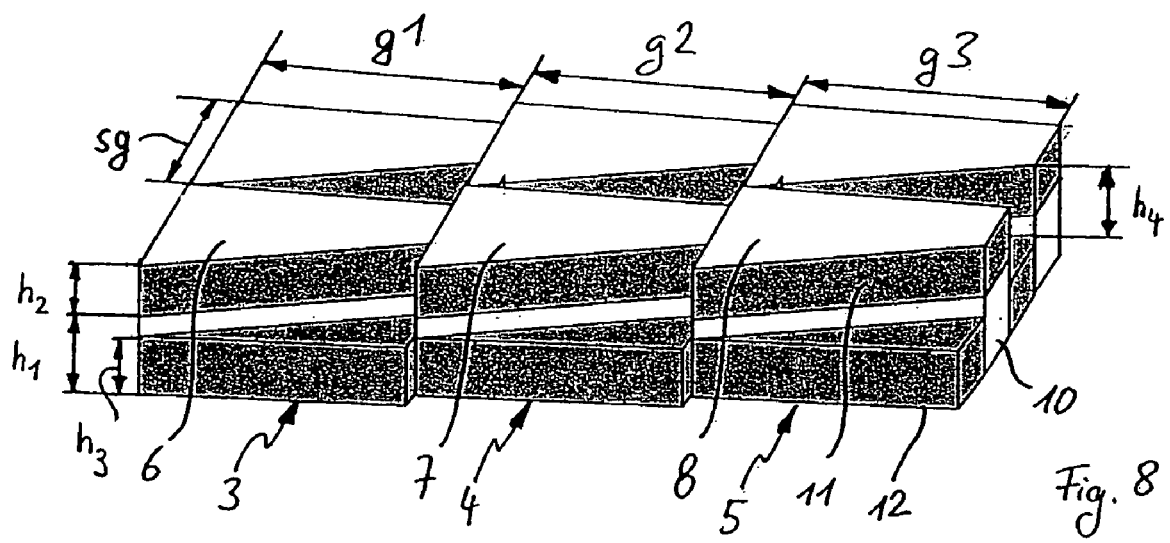
FIG. 8 shows a schematic perspective view of a further embodiment of the individual substructures.
Figure 9:
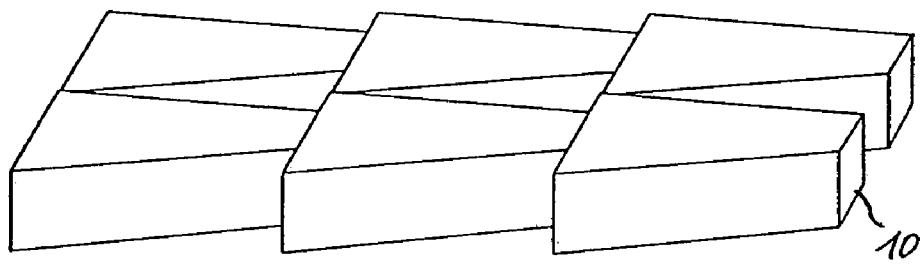
FIG. 9 shows a schematic perspective view of the bottom layer of the individual substructures of FIG. 8.

FIG. 8 schematically shows a further embodiment of the individual substructures 6, 7, 8. In this case, the individual substructures 6, 7 and 8 are formed by a lower layer 10 having a refractive index $n_1$ and by an upper layer 11 having a refractive index $n_2$. The lower layer 10 has a height $h_1$ and the upper layer 11 has a height $h_2$. In addition, a further layer 12 is arranged between the regions of the lower layer 10. The layer 12 is formed from a material having the refractive index $n_3$ and has a height $h_3$. In practice, such structure with $h_3=h_2$ and $n_2=n_3$ can be produced, for example, by first producing the lower layer 10, as shown in FIG. 9. Subsequently, a single coating step is carried out, ideally resulting in the structure of FIG. 8.

No further layer is applied on the layer 12 in the example of FIG. 8. However, it is possible, of course, to provide a further layer on the layer 12, said further layer having a refractive index $n_4$ and a height $h_4$, where $h_1+h_2=h_3+h_4$ shall apply. For this case and under assumption that $h_3<h_1$ and that a material (e.g., air) having the refractive index $n_0$ is present above the diffractive element, the averaged effective refractive index for such sub-wavelength pattern is obtained from optical path-length considerations as $$n_{\mathit{eff}} = \frac{h_3 n_{\mathit{eff}}^{(1,3)} + (h_1 - h_3) n_{\mathit{eff}}^{(1,4)} + h_2 n_{\mathit{eff}}^{(2,4)}}{h_1 + h_2} \qquad (5)$$

wherein $n_{\mathit{eff}}^{(i,j)}$ are the effective refractive indices resulting from the respective refractive indices $n_i$ and $n_j$, which are present at the partial heights $h_3$, $(h_1-h_3)$ and $h_2$. An analogous formula can be derived if $h_3>h_1$. The effective refractive indices $n_{\mathit{eff}}^{(i,j)}$ can be calculated according to formulas (6) to (9), which can be derived from the Effective Medium Theory, using the dielectric permitivity $\in = n^2$ instead of the refractive index, because this allows the ensuing formulas to be represented in a simpler manner. Further, second order terms have been included, because this also covers the case where the grating period sg, although close to the wavelength $\lambda$, is at the same time still small enough to allow only the zeroth order of diffraction of the sub-wavelength grating to propagate. The following holds for the TE polarization:

$$\varepsilon_{\it{eff2}}^{(i,j),TE} = \varepsilon_{\it{eff0}}^{(i,j),TE} + \frac{1}{3}\left(\pi\frac{sg}{\lambda}f(1-f)\left(\frac{1}{\varepsilon_i} - \frac{1}{\varepsilon_j}\right)\right)^2 \qquad (6)$$

with $$\left(\varepsilon_{\it{eff0}}^{(i,j),TE}\right)^3 \varepsilon_{\it{eff0}}^{(i,j),TM}$$

$$\varepsilon_{\it{eff0}}^{(i,j),TM} = f\varepsilon_i + (1-f)\varepsilon_j \qquad (7)$$

and $$\varepsilon_{\it{eff0}}^{(i,j),TE} = \frac{\varepsilon_i \varepsilon_j}{f\varepsilon_j + (1-f)\varepsilon_i} \qquad (8)$$

The following holds for the TM polarization:

$$\varepsilon_{\it{eff2}}^{(i,j),TM} = \varepsilon_{\it{eff0}}^{(i,j),TM} + \frac{1}{3}\left(\pi\frac{sg}{\lambda}f(1-f)(\varepsilon_i - \varepsilon_j)\right)^2 \qquad (9)$$

However, in the following it shall now be assumed that $h_1 = h_2 = h_3 = h_4 = h$, as well as $n_3 = n_2 > n_1$, and $n_4 = n_0$. In this case, formula (5) is simplified to $$n_{\it{eff}} = \frac{1}{2}(n_{\it{eff}}^{(1,2)} + n_{\it{eff}}^{(2,0)}) \qquad (10)$$

and is, therefore, independent of the thickness of the individual layers.

Figure 10:
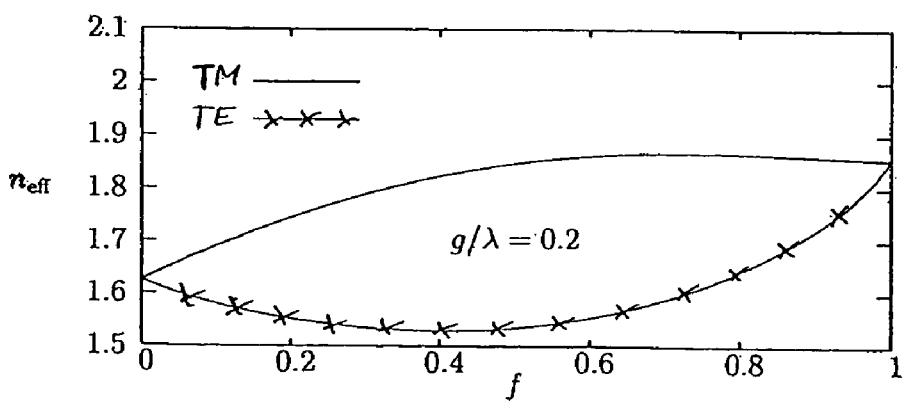
FIG. 10 shows the profile of the effective refractive index of the embodiment according to FIG. 8 in the case of TE and TM polarization.
Figure 13:
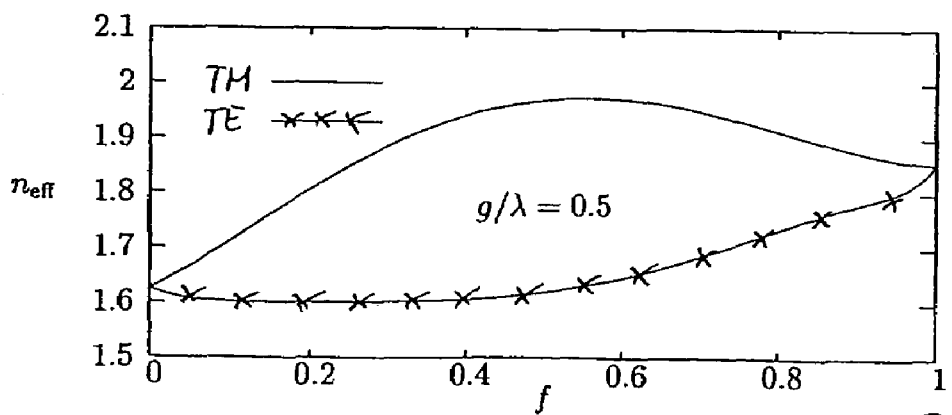
FIG. 13 shows the profile of the effective refractive index of the embodiment according to FIG. 11 in the case of TE polarization and of TM polarization.

The remaining free parameters are the filling ratio f and the wavelength-standardized grating period $sg/\lambda$ of the sub-lambda wavelength pattern. In the lower layer, the filling ratio f describes the fraction of the grating period which is filled with the material having the refractive index $n_1$; in the upper layer, it applies to the material having the refractive index $n_2$. Varying the filling ratio f for different standardized grating periods $sg/\lambda$, one will realize that $n_{\it{eff}}^{TM}$ is always greater than $n_{\it{eff}}^{TE}$ and that there are regions of f, where either $n_{\it{eff}}^{TM}$ or $n_{\it{eff}}^{TE}$ shows a plateau-like profile and is thus almost independent of f within a certain f region. For example, for $sg/\lambda = 0.2$, the TM polarization within the interval of $0.5 < f < 1$ is almost independent of f. At the same time, the TE polarization strongly increases in this region, as shown in FIG. 10, which shows the dependence of the effective refractive index $n_{\it{eff}}$ on the filling ratio f for the TE and TM polarizations. The opposite profile results from $sg/\lambda = 0.5$. In this case, there is a plateau-like profile for the TE polarization within the range from $0 < f < 0.5$ and a strong increase for the TM polarization within said range, as shown in FIG. 13.

Based on the thus-determined profile of the effective refractive index of the filling ratio, the filling ratio profile can be selected as a function of the radial coordinate x (i.e. perpendicular to the direction of extension R1, R2, R3) such that the desired, e.g., linear refractive index profile is achieved as a function of the radial coordinate. For the sake of simplicity, the resulting non-linear profile of the triangle sides S2, S3 is not shown in FIGS. 8, 9 as well as FIGS. 11 and 12.

The profile of the effective refractive index $n_{\it{eff}}$ shown in FIG. 10 as a function of the filling ratio f is utilized in the embodiment of FIG. 8, which only shows good blazing for the TE polarization, i.e. the TE polarization is diffracted into the desired blaze order with great efficiency. In contrast thereto, the TM polarization is diffracted very poorly into the desired blaze order (in this case, the first order of diffraction). The TM polarization mainly passes into orders of diffraction other than the desired blaze order, i.e. in this case, mainly the zeroth order of diffraction of the blaze structure. Since the filling ratio f satisfies the following inequality: $0.5 < f < 1$, the individual substructures 6, 7, 8 are cut off at the tip such that they are essentially trapezoidal.

The following Table 1 shows the results of the rigorous calculation for this example with $sg/\lambda = 0.2$ and $0.5 < f < 1$. The filling ratio was determined such that the minimum $n_{\it{eff}}^{TE} = 1.55$ at the left edge of the period and the maximum $n_{\it{eff}}^{TE} = 1.86$ at the right edge of the period applies. The height h of the individual layers is obtained from the blaze condition.

$$h = \frac{\lambda}{2(\max(n_{\it{eff}}^{TE}) - \min(n_{\it{eff}}^{TE}))} \qquad (11)$$

The index at TE, TM refers to the orders of diffraction of the diffraction caused at the blaze structures 3, 4 and 5.

TABLE 1

| g/λ | TM$_0$ | TM$_1$ | TE$_0$ | TE$_1$ | TE$_1$/(TE$_1$+TM$_1$) |
|---|---|---|---|---|---|
| 5 | 0.7276 | 0.0208 | 0.0041 | 0.7332 | 0.972 |

As can be seen, in the case of the TE polarization, a great part of the incident light is directed into the first blaze order, while the TM polarization passes mainly into the zeroth order. The polarization effect is excellent, and even for the relatively small blaze grating period of $g = 5\lambda$, the degree of polarization is as high as 97.2%.

Figure 11:
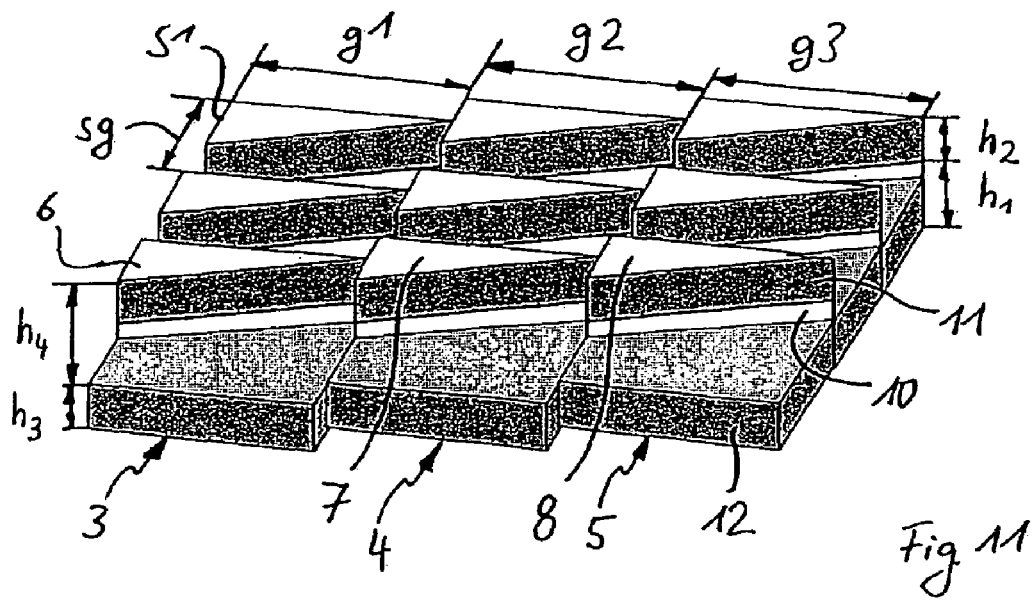
FIG. 11 shows a schematic perspective view of a further embodiment of the individual substructures.
Figure 12:
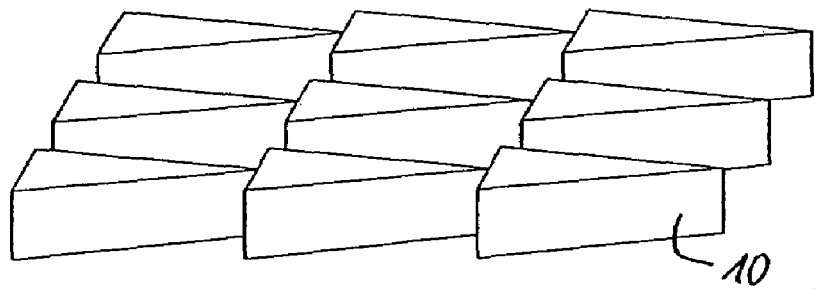
FIG. 12 shows a schematic perspective view of the lower layer of the individual substructures of FIG. 11.

Table 2 shows selected parameters for which the blaze effect occurs in the case of the TM polarization. In this case, $sg/\lambda = 0.5$ and $0 < f < 0.5$, wherein f has been selected such that $n_{\it{eff}}^{TM} = 1.63$ at the left edge of the period and $n_{\it{eff}}^{TM} = 1.9$ at the right edge of the period applies. The degree of polarization is 98.4% in this case. The respective profile of the effective refractive index $n_{\it{eff}}$ as a function of the filling ratio f is shown in FIG. 13. FIG. 11 shows an illustration of the possible shape of the individual substructures 6, 7, 8. As is evident from the illustration, the individual substructures are triangles (when viewed from above) which do not contact each other in the direction of the sub-wavelength period sg, but are spaced apart. Thus, the length of the side S1 is smaller here than the sub-wavelength period sg. Like FIG. 9, FIG. 12 only shows the lower layer 10.

TABLE 2

| g/λ | TM$_0$ | TM$_1$ | TE$_0$ | TE$_1$ | TM$_1$/(TE$_1$+TM$_1$) |
|---|---|---|---|---|---|
| 5 | 0.0096 | 0.7058 | 0.7543 | 0.0117 | 0.984 |

The above calculations were always based on the assumption that the radiation is vertically incident on the lens, so that the angle of incidence is 0°. If the angle of incidence does not equal 0°, it may be required, from a certain angle of incidence onward, to take said angle into consideration when determining the sub-wavelength period sg and, if required, when performing the above calculations. In any case, the sub-wavelength period sg should always be selected so as to allow only the zeroth order of diffraction relative to the sub-wavelength pattern to propagate.

Of course, not all blaze structures 3, 4, 5 have to be realized by means of the described sub-lambda wavelength pattern. It is also possible to provide conventionally blazed diffraction patterns having a ramp-shaped profile for the blaze structures 3, 4, 5. Especially in the case of the lens according to FIG. 1, the inner blaze structures which still have a relatively large blaze period may have a conventional design, and the outer blaze structures are then realized, as described, by means of the individual substructures.

When viewed from above, the individual substructures 6, 7, 8 may form any self-contained surface, in particular the described triangular shape, which may also be referred to as having the shape of a piece of cake or a crest-like shape. Of course, when viewed from above, polygon-type shapes are also possible for individual sides.

The invention claimed is:

1. A polarization-selectively blazed, diffractive optical element comprising:
a plurality of contiguous blaze structures, which extend along a given geometrical path and each of which have a width perpendicular to a direction of extension, said width being greater than the wavelength of the electromagnetic radiation for which the diffractive optical element is designed, and each of said blaze structures comprising a plurality of individual substructures, which are arranged adjacent to each other in the direction of extension according to a predetermined period, said substructures providing a blaze effect and each substructure having the shape, when viewed from above, of a closed geometrical figure whose dimension parallel to the direction of extension varies perpendicular to the direction of extension, but is always smaller than the wavelength of the electromagnetic radiation, and whose maximum dimension perpendicular to the direction of extension is greater than the wavelength of the electromagnetic radiation, wherein the filling ratio of the individual substructures in the direction of the extension relative to the period is selected such that, as a function of a position perpendicular to the direction of extension, the blaze effect is optimized for one of two mutually orthogonal polarization conditions of the electromagnetic radiation.

2. The element as claimed in claim 1, wherein the individual substructures comprise a first layer having a first refractive index and a second layer having a second refractive index that is different from the first refractive index, said second layer being arranged on the first layer.

3. The element as claimed in claim 2, wherein a third layer having the second refractive index is arranged between the individual substructures in the region of the first layer.

4. The element as claimed in claim 3, wherein the second and third layers are equal in height.

5. The element as claimed in claim 2, wherein individual structures are arranged between the individual substructures, said individual structures comprising a third layer having a third refractive index and a fourth layer having a fourth refractive index.

6. The element as claimed in claim 1, wherein the filling ratio is selected such that it does not cover the entire region of from 0 to 1.

7. The element as claimed in claim 1, wherein the size of the range covered by the filling ratio is not greater than 0.7.

8. The element as claimed in claim 1, wherein the two orthogonal polarization conditions are linear polarization conditions.

9. The element as claimed in claim 1, wherein the filling ratio is selected so as to result in a predetermined profile of the effective refractive index for the electromagnetic radiation of said one polarization condition.

10. The element as claimed in claim 1, wherein the width of the blaze structures is varied such that the element has an imaging property.

11. The element as claimed in claim 1, wherein the contiguous blaze structures are each ring-shaped, when viewed from above.

12. The element as claimed in claim 1, wherein the individual substructures of a blaze structure are each arranged so as to have rotational symmetry.

13. The element as claimed in claim 1, wherein the predetermined geometrical path is a path line which is not self-contained.

14. The element as claimed in claim 1, further comprising a phase element arranged preceding or following the diffractive element, which causes a locally varying phase displacement in the electromagnetic beam incident on or coming from the diffractive element.

15. The element as claimed in claim 1, further comprising a polarization element arranged preceding the diffractive element, said polarization element pre-polarizing the electromagnetic beam for the diffractive element at least partially into said one orthogonal polarization condition.

16. An objective comprising at least one polarization-selectively blazed, diffractive optical element comprising a plurality of contiguous blaze structures, which extend along a given geometrical path and each of which have a width perpendicular to a direction of extension, said width being greater than the wavelength of the electromagnetic radiation for which the diffractive optical element is designed, and each of said blaze structures comprising a plurality of individual substructures, which are arranged adjacent to each other in the direction of extension according to a predetermined period, said substructures providing a blaze effect and each substructure having the shape, when viewed from above, of a closed geometrical figure whose dimension parallel to the direction of extension varies perpendicular to the direction of extension, but is always smaller than the wavelength of the electromagnetic radiation, and whose maximum dimension perpendicular to the direction of extension is greater than the wavelength of the electromagnetic radiation, wherein the filling ratio of the individual substructures in the direction of extension relative to the period is selected such that, as a function of the position perpendicular to the direction of extension, the blaze effect is optimized for one of two mutually orthogonal polarization conditions of the electromagnetic radiation.

17. A polarization-selectively blazed, diffractive optical element comprising:
a plurality of contiguous blaze structures, which extend along a given geometrical path and each of which have a base, an altitude and two sides, the base having a width perpendicular to a direction of extension, said width being greater than the wavelength of the electromagnetic radiation for which the diffractive optical element is designed, and each of said blaze structures comprising a plurality of individual substructures, which are arranged adjacent to each other in the direction of extension according to a predetermined period, said substructures providing a blaze effect and each substructure having the shape, when viewed from above, of a closed three sided geometrical figure whose dimension parallel to the base is always smaller than the wavelength of the electromagnetic radiation, and whose said altitude is greater than the wavelength of the electromagnetic radiation, wherein the filling ratio of the individual substructures in the direction of extension relative to the period is selected such that, as a function of a position perpendicular to the direction of extension, the blaze effect is optimized for one of two mutually orthogonal polarization conditions of the electromagnetic radiation.

18. The element as claimed in claim 17, wherein the individual substructures comprise a first layer having a first refractive index and a second layer having a second refractive index that is different from the first refractive index, said second layer being arranged on the first layer.

19. The element as claimed in claim 18, wherein a third layer having the second refractive index is arranged between the individual substructures in the region of the first layer.

20. The element as claimed in claim 19, wherein the second and third layers are equal in height.

21. The element as claimed in claim 18, wherein individual structures are arranged between the individual substructures, said individual structures comprising a third layer having a third refractive index and a fourth layer having a fourth refractive index.

22. The element as claimed in claim 17, wherein the filling ratio is selected such that it does not cover the entire region of from 0 to 1.

23. The element as claimed in claim 17, wherein the size of the range covered by the filling ratio is not greater than 0.7.

* * * * *

UNITED STATES PATENT AND TRADEMARK OFFICE
CERTIFICATE OF CORRECTION

| | |
|---|---|
| PATENT NO. | : 7,408,712 B2 |
| APPLICATION NO. | : 11/206886 |
| DATED | : August 5, 2008 |
| INVENTOR(S) | : Johannes Ruoff et al. |

It is certified that error appears in the above-identified patent and that said Letters Patent is hereby corrected as shown below:

On the Title Page, under Item (73) Assignee: delete "Jena" and insert --Oberkochen--

Signed and Sealed this
Twenty-fifth Day of January, 2011

David J. Kappos
*Director of the United States Patent and Trademark Office*